United States Patent
Thakur

[19]

[11] Patent Number: 6,114,222
[45] Date of Patent: Sep. 5, 2000

[54] METHOD TO CURE MOBILE ION CONTAMINATION IN SEMICONDUCTOR PROCESSING

[75] Inventor: Randhir P. S. Thakur, Boise, Id.

[73] Assignee: Micron Technology, Inc., Boise, Id.

[21] Appl. No.: 09/071,501

[22] Filed: May 1, 1998

Related U.S. Application Data

[63] Continuation of application No. 08/759,152, Nov. 27, 1996, Pat. No. 5,780,364, which is a continuation of application No. 08/353,768, Dec. 12, 1994, abandoned.

[51] Int. Cl.[7] .................................................. H01C 21/324
[52] U.S. Cl. .................... 438/471; 438/624; 438/760; 438/791; 438/775; 438/761
[58] Field of Search .................................... 438/471, 775, 438/760, 791, 761, 954, 624; 427/248.1, 255; 257/620

[56] References Cited

U.S. PATENT DOCUMENTS

| | | | |
|---|---|---|---|
| 4,740,483 | 4/1988 | Tobin | 148/112 |
| 4,980,307 | 12/1990 | Ito et al. | 148/114 |
| 5,003,062 | 3/1991 | Yen | 437/231 |
| 5,043,224 | 8/1991 | Tarrodine et al. | 437/239 |
| 5,306,945 | 4/1994 | Drummond | 257/620 |
| 5,376,593 | 12/1994 | Sandhu et al. | 437/242 |
| 5,384,288 | 1/1995 | Ying | 437/228 |
| 5,409,858 | 4/1995 | Thakur et al. | 437/173 |
| 5,422,291 | 6/1995 | Clementi et al. | 148/114 |
| 5,444,026 | 8/1995 | Kim et al. | 437/240 |
| 5,478,765 | 12/1995 | Kwong et al. | 437/242 |
| 5,716,673 | 2/1998 | Yen et al. | 427/240 |
| 5,871,811 | 2/1999 | Wang et al. | 427/248.1 |
| 5,883,001 | 3/1999 | Jin et al. | 438/624 |

FOREIGN PATENT DOCUMENTS

| | | | |
|---|---|---|---|
| 0024481 | 2/1980 | Japan | 437/235 |
| 0085829 | 7/1981 | Japan | 437/240 |
| 0153751 | 11/1981 | Japan | 437/241 |
| 0174927 | 7/1987 | Japan | 437/241 |
| 0207932 | 8/1989 | Japan | 437/978 |
| 0170430 | 7/1990 | Japan | 437/241 |

*Primary Examiner*—Matthew Smith
*Assistant Examiner*—Victor Yevsikov

[57] ABSTRACT

A first embodiment of the present invention introduces a method to cure mobile ion contamination in a semiconductor device during semiconductor processing by the steps of: forming active field effect transistors in a starting substrate; forming a first insulating layer over the field effect transistor and the field oxide; forming a second insulating layer over the first insulating layer; and performing an annealing step in a nitrogen containing gas ambient prior to exposing the insulating layer to mobile ion impurities. A second embodiment teaches a method to cure mobile ion contamination during semiconductor processing by annealing an insulating layer in a nitrogen containing gas ambient prior to exposing said insulating layer to mobile ion impurities.

43 Claims, 4 Drawing Sheets

METHOD TO CURE MOBILE ION CONTAMINATION IN SEMICONDUCTOR PROCESSING

This application is a continuation to U.S. patent application Ser. No. 08/759,152, filed Nov. 27, 1996 U.S. Pat. No. 5,780,364, which is a continuation to U.S. patent application Ser. No. 08/353,768, filed Dec. 12, 1994 now abandoned.

FIELD OF THE INVENTION

This invention relates generally to semiconductor fabrication and in particular to a method to cure mobile ion contamination during semiconductor processing.

BACKGROUND OF THE INVENTION

As is well documented, mobile ion contamination can limit die yields during semiconductor processing. In the clean room environment, the scope of mobile ions (particularly sodium ions), incorporated during semiconductor processing can come from moisture, water rinsing, plasma processing and excess exposure to air, etc. Sodium ions in particular are generated very easily and can play an active role in causing contamination when introduced at very low temperatures.

The text book "Instabilities In Silicon Devices," (Elsevier Science Publishers B. V. (North-Holland), 1986 has a chapter devoted to mobile ion contamination. Chapter 8, pp. 403–439, entitled "Mobile Ions in $SiO_2$ Layers On Si" provides a thorough teaching on mobile ions contamination, which is hereby incorporated by reference.

Mobile ion contamination is very prevalent in today's semiconductor processing. The semiconductor fabrication industry would benefit greatly from a method to cure mobile ion contamination during processing and such a cure is set forth by the methods of the present invention.

SUMMARY OF THE INVENTION

A first embodiment of the present invention introduces a method to cure mobile ion contamination in a semiconductor device during semiconductor processing by the steps of:

a) forming active field effect transistors in a starting substrate;

b) forming a first insulating layer over the field effect transistor and the field oxide;

c) forming a second insulating layer over the first insulating layer; and d) performing an annealing step in a nitrogen containing gas ambient prior to exposing the insulating layer to mobile ion impurities.

A second embodiment teaches a method to cure mobile ion contamination during semiconductor processing by annealing an insulating layer in a nitrogen containing gas ambient prior to exposing said insulating layer to mobile ion impurities.

DETAILED DESCRIPTION OF THE INVENTION

Figure 1:
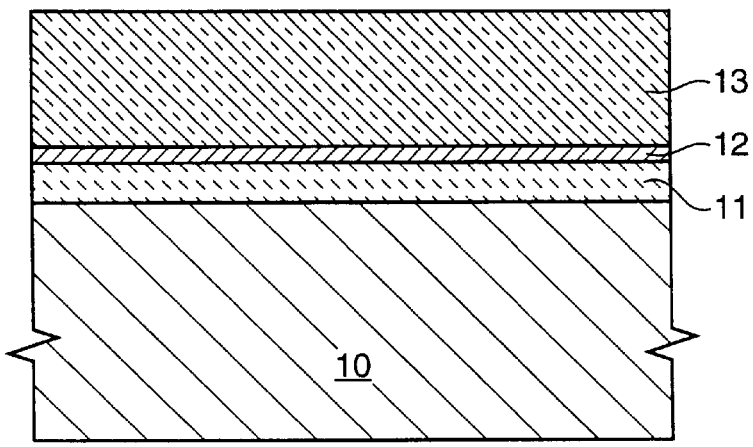
FIG. 1 is a composite cross-sectional view of an in process wafer portion depicting a first embodiment of the present invention.
Figure 2:
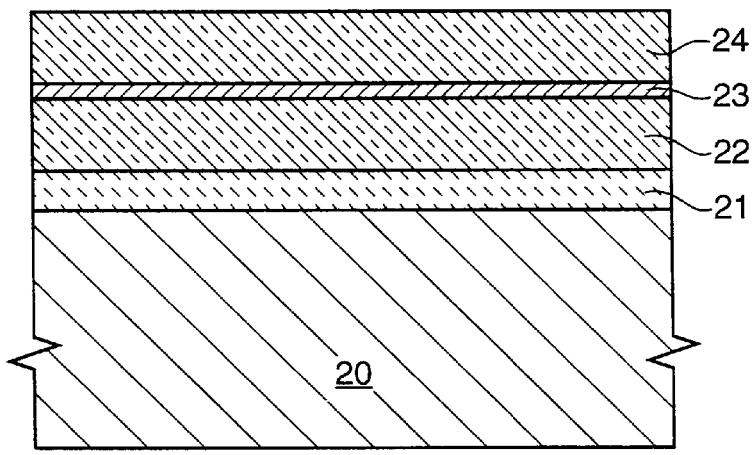
FIG. 2 is a composite cross-sectional view of an in process wafer portion depicting a second embodiment of the present invention.
Figure 3:
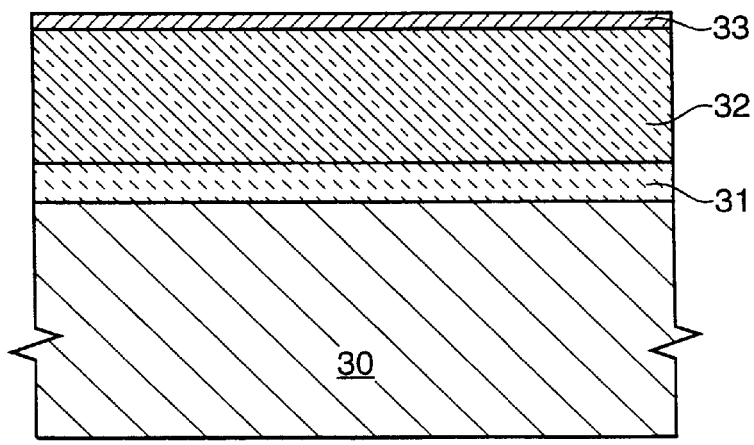
FIG. 3 is a composite cross-sectional view of an in process wafer portion depicting a third embodiment of the present invention.

The present invention, as depicted in the embodiments of FIGS. 1–3, demonstrates the general concept of preventing ion contamination that may be implemented during any semiconductor fabrication process which would benefit curing mobile ion contamination.

Figure 4:
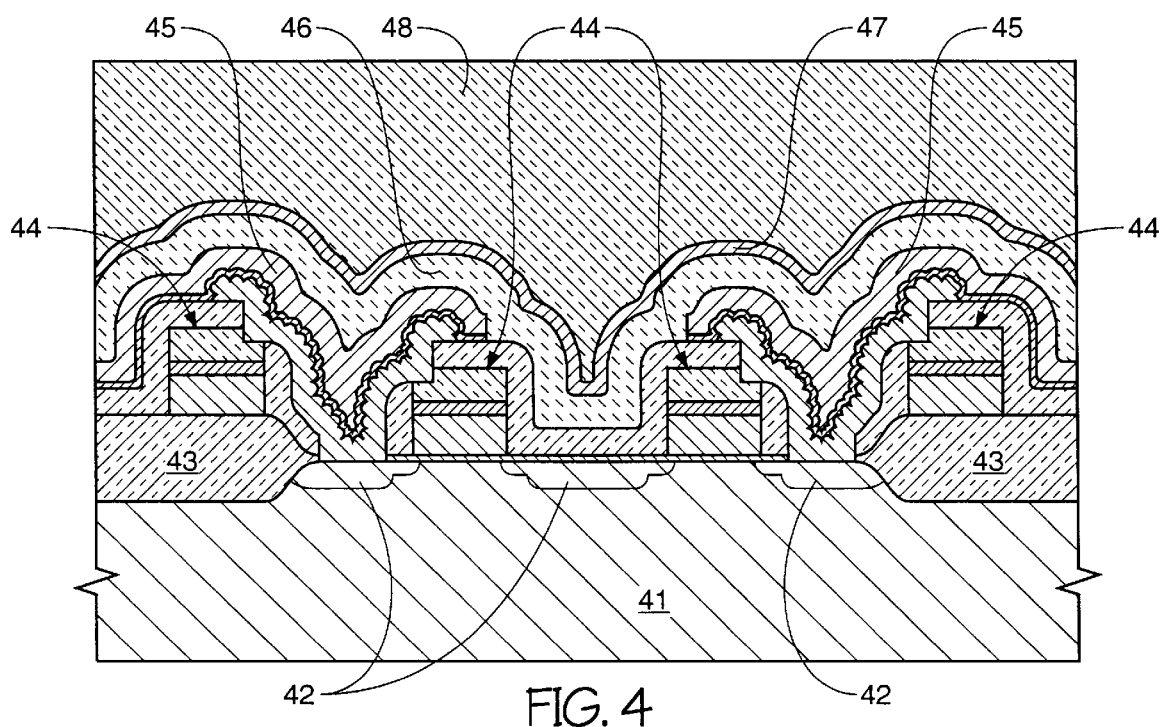
FIG. 4 is a composite cross-sectional view of an in process wafer portion depicting a fourth embodiment of the present invention.
Figure 5:
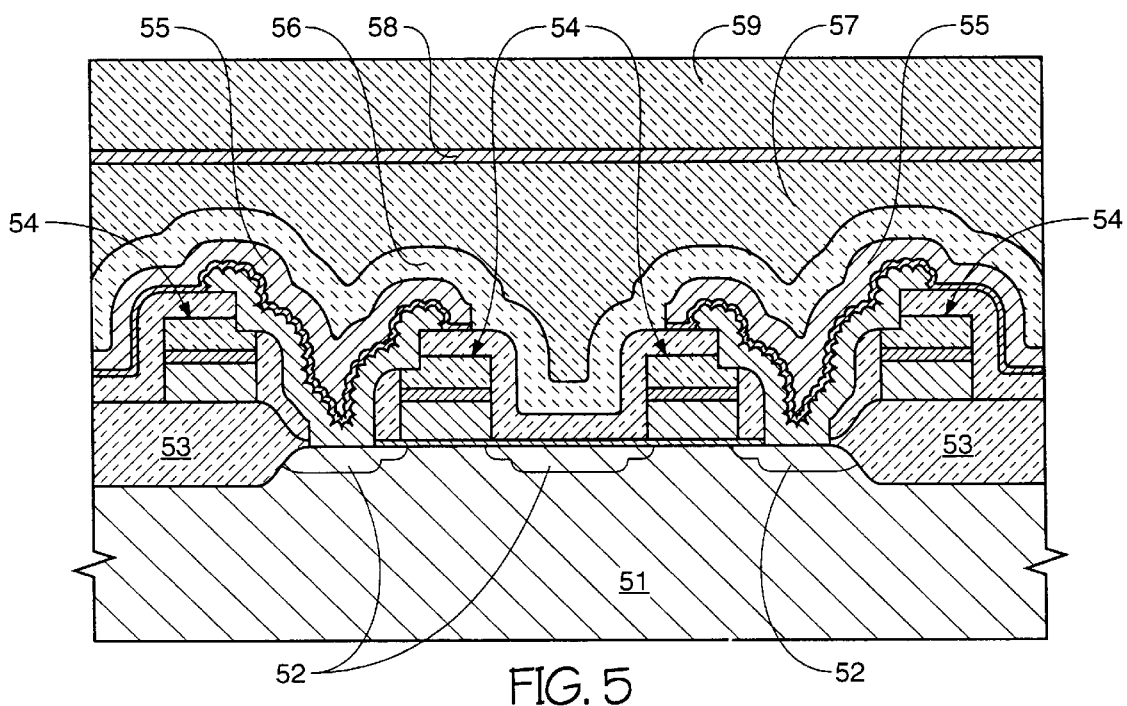
FIG. 5 is a composite cross-sectional view of an in process wafer portion depicting a fifth embodiment of the present invention.
Figure 6:
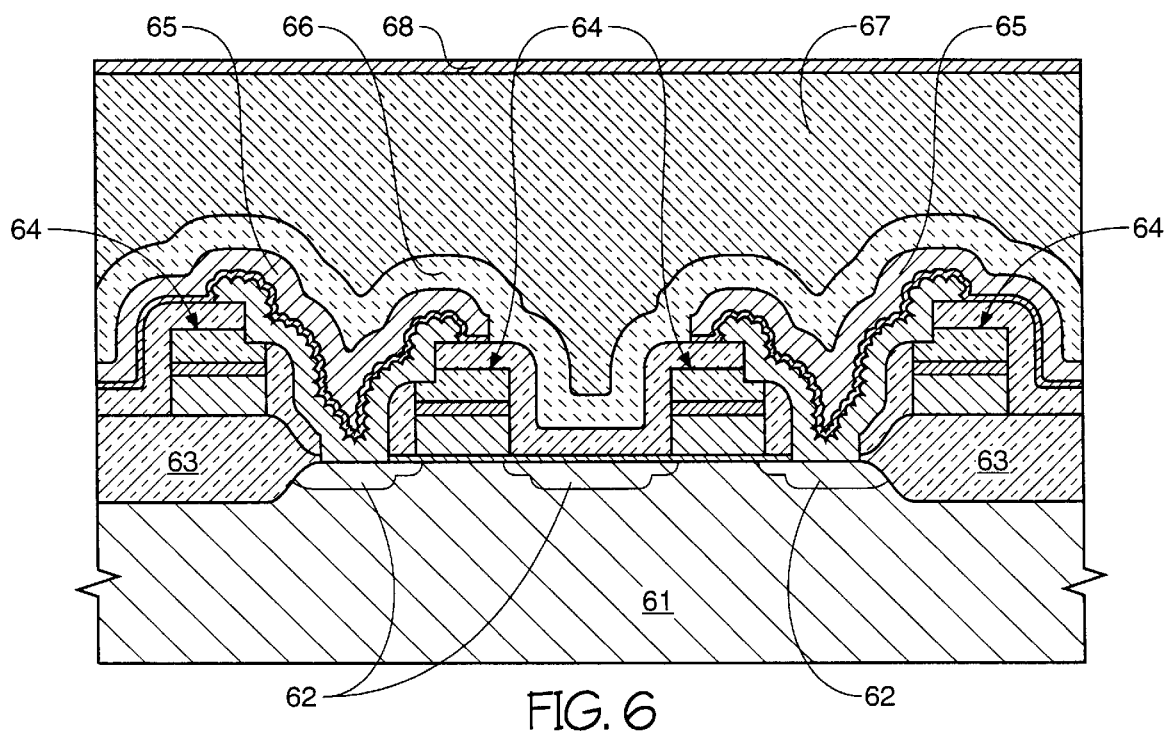
FIG. 6 is a composite cross-sectional view of an in process wafer portion depicting a sixth embodiment of the present invention.

The present invention, as depicted in the embodiments of FIGS. 4–6, demonstrates specific examples of preventing ion contamination when integrated into the fabrication of a dynamic random access memory (DRAM). As mentioned above, one skilled in the art will recognize from the detailed description that follows, that the present invention may be integrated into any semiconductor fabrication process.

In a first embodiment of the present invention and referring now to FIG. 1, supporting substrate 10, which depicts any type of material used in semiconductor fabrication, is prepared. Next, an insulating layer 11 is formed over substrate 10. Layer 11 may be an oxide and in the present invention TEOS (tetra-ethyl-ortho-silicate) is preferred. Next, a nitride layer 12 is formed over layer 11 by the use of a rapid thermal nitridation process. Finally, a glass layer 13 is formed over nitride layer 12.

In a second embodiment of the present invention and referring now to FIG. 2, supporting substrate 20, which depicts any type of material used in semiconductor fabrication, is prepared. Next, an insulating layer 21 is formed over substrate 20. Layer 21 may be an oxide and in the present invention TEOS (tetra-ethyl-ortho-silicate) is preferred. Next, a first glass layer 22 is formed over layer 21. Next, a nitride layer 23 is formed over layer 22 by the use of a rapid thermal nitridation process. Finally, a second glass layer 24 is formed over nitride layer 23.

In a third embodiment of the present invention and referring now to FIG. 3, supporting substrate 30, which depicts any type of material used in semiconductor fabrication, is prepared. Next, an insulating layer 31 is formed over substrate 30. Layer 31 may be an oxide and in the present invention TEOS (tetra-ethyl-ortho-silicate) is preferred. Next, a glass layer 32 is formed over layer 31. Finally, a nitride layer 33 is formed over layer 32 by the use of a rapid thermal nitridation (RTN) process.

In each of the three general embodiments above mobile ion contamination is cured during semiconductor processing by annealing the an exposed insulating layer in a nitrogen containing gas ambient to form the nitride layer. This formation of the nitride layer by RTN is performed prior to exposing said insulating layer to mobile ion impurities.

The annealing temperature, using the nitrogen containing gas in a rapid thermal nitridation processing system, is set at a temperature of at least 650° C. or higher. The nitrogen containing gas used may be gases from the oxygen/nitrogen gas species, such as comprises $N_2O$, $NO$, $O_x$, and $N_xO_y$. However, the preferred nitrogen containing gases are $NH_3$, $N_2O$, or a combination of $NH_3$ and $N_2O$. In addition to the nitrogen containing gases a fluorine based gas may be introduced into the nitrogen containing gas ambient or anneal may be done in fluorine gas by itself to reduce the threshold voltage shift due to mobile ions. There are various effective ways to perform the anneal cycle. For example, the first part of the anneal cycle may be performed in NH$_3$ which is then followed by N$_2$O or the first part of the anneal cycle may be performed in N$_2$O which is then followed by NH$_3$.

The insulating layer may be impurity doped glasses, such as BPSG (borophosphosilicate glass), BSG (borosilicate glass), and PSG (phosphosilicate glass). The insulating layer may also be undoped glasses or dielectric oxides.

The mobile ion contamination (Alkali ions and in particular sodium ions are of the main concern.) that the present invention cures, enters the during various fabrication steps, especially during planarization and cleaning steps of a top insulating layer. The presence of the RTN formed nitride film blocks the mobile ions (such as sodium ions) from penetrating into the underlying material. As know to those skilled in the art, mobile ion contamination present in an insulating material that borders an diffusion region (such as the source/drain region of a field effect transistor) can cause leakage and render the active circuitry as defective.

In a fourth embodiment of the present invention and referring now to FIG. 4, supporting silicon substrate 41, diffusion regions 42, field oxide regions 43, word lines 44, storage capacitors 45, and TEOS layer 46 have been processed using fabrication processes used in memory device manufacture. Next, in accordance with the present invention, a nitride layer 47 is formed over TEOS layer 46 by the use of a rapid thermal nitridation process. Finally, a planarized glass layer 48 is formed over nitride layer 47.

In a fifth embodiment of the present invention and referring now to FIG. 5, supporting silicon substrate 51, diffusion regions 52, field oxide regions 53, word lines 54, storage capacitors 55, and TEOS layer 56 have been processed using fabrication processes used in memory device manufacture. Next, in accordance with the present invention a first glass layer 57 is formed over TEOS layer 56. Next, a nitride layer 58 is formed over first glass layer 57 by the use of a rapid thermal nitridation process. Finally, a second glass layer 59 is formed over nitride layer 58.

In a sixth embodiment of the present invention and referring now to FIG. 6, supporting silicon substrate 1, diffusion regions 62, field oxide regions 63, word lines 64, storage capacitors 65, and TEOS layer 66 have been processed using fabrication processes used in memory device manufacture. Next, in accordance with the present invention a glass layer 67 is formed over TEOS layer 66. Finally, a nitride layer 68 is formed over layer 67 by the use of a rapid thermal nitridation (RTN) process.

In each of the three specific embodiments above mobile ion contamination is cured during semiconductor processing by annealing an exposed underlying layer in a nitrogen containing gas ambient to form the nitride layer. This formation of the nitride layer by RTN is performed prior to exposing the insulating layer to mobile ion impurities and it is preferred to perform this RTN processing during a single RTN step.

The annealing temperature, using the nitrogen containing gas in a rapid thermal nitridation processing system, is set at a temperature of at least 650° C. or higher. The nitrogen containing gas may be gases from the oxygen/nitrogen gas species, such as comprises N$_2$O, NO, O$_x$, and N$_x$O$_y$. However, the preferred nitrogen containing gases are NH$_3$, N$_2$O, or a combination of NH$_3$ and N$_2$O. In addition to the nitrogen containing gases a fluorine based gas may be introduced into the nitrogen containing gas ambient for or anneal may be done in fluorine gas by itself to reduce the threshold voltage shift due to mobile ions. There are various effective ways to perform the anneal cycle. For example, the first part of the anneal cycle may be performed in NH$_3$ which is then followed by N$_2$O or the first part of the anneal cycle may be performed in N$_2$O which is then followed by NH$_3$.

The insulating layer may be impurity doped glasses, such as BPSG (borophosphosilicate glass), BSG (borosilicate glass), and PSG (phosphosilicate glass). The insulating layer may also be undoped glasses or dielectric oxides.

The mobile ion contamination (Alkali ions and in particular sodium ions are of the main concern.) that the present invention cures, is introduced during fabrication and especially during planarization and cleaning steps of a top insulating layer. The presence of the RTN formed nitride film blocks the mobile ions (such as sodium ions) from penetrating into the underlying material. As know to those skilled in the art mobile ion contamination present in an insulating material that borders an diffusion region (such as the source/drain region of a field effect transistor) can cause leakage and render the active circuitry as defective.

It is to be understood that although the present invention has been described in a preferred embodiment, various modifications known to those skilled in the art may be made without departing from the invention as recited in the several claims appended hereto.

What is claimed is:

1. A method to reduce mobile ion contamination in a semiconductor device during semiconductor processing, said method comprising the steps of:
   forming active field effect transistors in a starting substrate;
   forming a first insulating layer over said field effect transistors;
   forming a second insulating layer over said first insulating layer; and
   performing an annealing step in a nitrogen gas ambient and a fluorine based gas prior to exposing said first and second insulating layers to mobile ion impurities.

2. The method of claim 1 further comprising the steps of:
   forming a layer having a planarized surface over said second insulating layer; and
   cleaning said planarized surface.

3. The method of claim 2 wherein said step of forming a layer having a planarized surface comprises forming a layer of planarized insulating glass.

4. The method of claim 3 wherein said insulating glass comprises BPSG.

5. The method of claim 3 wherein said insulating glass comprises BSG.

6. The method of claim 3 wherein said insulating glass comprises PSG.

7. The method of claim 2 wherein said nitrogen containing gas comprises NH$_3$.

8. The method of claim 2 wherein said nitrogen gas ambient comprises gases from an oxygen/nitrogen gas species.

9. The method of claim 8 wherein said oxygen/nitrogen gas species comprises N$_2$O, NO, O$_x$, and N$_x$O$_y$.

10. The method of claim 2 wherein said nitrogen containing gas comprises a combination of NH$_3$ and N$_2$O.

11. The method of claim 2 wherein a first part of the anneal step contains NH$_3$ and followed by N$_2$O.

12. The method of claim 2 wherein a first part of the anneal step contains N$_2$O followed by NH$_3$.

13. The method of claim 1 wherein said annealing step comprises annealing conditions of using said nitrogen gas ambient in a rapid thermal processing system at a temperature of at least 650° C.

14. The method of claim 1 wherein said annealing step is a single rapid thermal processing cycle.

15. The method of claim 1 wherein said annealing step is a single rapid thermal nitridation processing cycle.

16. The method of claim 1 wherein said annealing step comprises annealing conditions of using said nitrogen gas ambient in a furnace at a temperature of at least 650° C.

17. The method of claim 1 wherein said annealing step is performed between said formation of said first and second insulating layers.

18. The method of claim 1 wherein said annealing step is performed after said formation of said second insulating layer.

19. The method of claim 1 wherein said second insulating layer is partially formed, followed by said annealing step which is then followed by the complete formation of said second insulating layer.

20. The method of claim 1 wherein said second insulating layer comprises BPSG.

21. The method of claim 1 wherein said second insulating layer comprises BSG.

22. The method of claim 1 wherein said second insulating layer comprises PSG.

23. The method of claim 1 wherein said second insulating layer comprises an impurity doped glass.

24. The method of claim 1 wherein said second insulating layer comprises an undoped glass.

25. The method of claim 1 wherein said second insulating layer comprises a dielectric oxide.

26. The method of claim 1 wherein said mobile ion impurities comprise alkali ions.

27. The method of claim 26 wherein said alkali ions comprise sodium ions.

28. A method to cure mobile ion contamination during semiconductor processing, said method comprising annealing an insulating layer in a nitrogen gas ambient and a fluorine based gas prior to exposing said insulating layer to mobile ion impurities.

29. The method of claim 28 wherein said annealing comprises annealing conditions of using said nitrogen gas ambient in a rapid thermal processing system at a temperature of at least 650° C.

30. The method of claim 29 wherein said nitrogen containing gas comprises $NH_3$.

31. The method of claim 29 wherein said nitrogen containing gas comprises $N_2O$.

32. The method of claim 29 wherein said nitrogen containing gas comprises a combination of $NH_3$ and $N_2O$.

33. The method of claim 28 wherein said insulating layer comprises BPSG.

34. The method of claim 28 wherein said insulating layer comprises BSG.

35. The method of claim 28 wherein said insulating layer comprises PSG.

36. The method of claim 28 wherein said insulating layer comprises an impurity doped glass.

37. The method of claim 28 wherein said insulating layer comprises an undoped glass.

38. The method of claim 28 wherein said insulating layer comprises a dielectric oxide.

39. The method of claim 28 wherein said mobile ion impurities comprise alkali ions.

40. The method of claim 39 wherein said alkali ions comprise sodium ions.

41. A method of reducing mobile ion contamination of a semiconductor substrate method comprising the steps of:

forming a dielectric layer over said substrate; and heating said substrate and dielectric layer in a gas ambient comprising nitrogen and fluorine sufficiently to at least partially anneal said dielectric layer and said substrate.

42. The method of claim 41, further comprising the step of:

forming a nitride layer over said substrate prior to forming said dielectric layer over said substrate.

43. A method of reducing mobile ion contamination of a semiconductor substrate method comprising the steps of:

forming a dielectric layer over said substrate; and annealing said dielectric layer in the presence of a gas comprising fluorine and at least one of nitrogen or oxygen.

* * * * *